United States Patent
Knudsen

(10) Patent No.: US 9,041,574 B2
(45) Date of Patent: May 26, 2015

(54) INPUT CONVERTER FOR A HEARING AID AND SIGNAL CONVERSION METHOD

(71) Applicant: Widex A/S, Lynge (DK)

(72) Inventor: Niels Ole Knudsen, Humlebaek (DK)

(73) Assignee: Widex A/S, Lynge (DK)

( * ) Notice: Subject to any disclaimer, the term of this patent is extended or adjusted under 35 U.S.C. 154(b) by 184 days.

(21) Appl. No.: 13/905,301

(22) Filed: May 30, 2013

(65) Prior Publication Data

US 2013/0249726 A1    Sep. 26, 2013

Related U.S. Application Data

(60) Division of application No. 13/242,719, filed on Sep. 23, 2011, now Pat. No. 8,493,256, which is a continuation-in-part of application No. PCT/EP2009/055279, filed on Apr. 30, 2009.

(51) Int. Cl.
*H03M 3/00* (2006.01)
*H03M 1/00* (2006.01)
(Continued)

(52) U.S. Cl.
CPC ............... *H03M 1/002* (2013.01); *H03M 3/43* (2013.01); *H03M 3/484* (2013.01); *H03M 3/486* (2013.01); *H04R 25/505* (2013.01); *H03M 1/12* (2013.01); *H03M 3/458* (2013.01)

(58) Field of Classification Search
CPC ....... H03M 3/43; H03M 3/484; H03M 3/486; H04R 25/505
USPC .................................................. 341/143, 172
See application file for complete search history.

(56) References Cited

U.S. PATENT DOCUMENTS 5,134,401 A * 7/1992 McCartney et al. .......... 341/143
5,659,314 A   8/1997 Tokura et al.
(Continued)

FOREIGN PATENT DOCUMENTS

EP    1102405 A1    5/2001

OTHER PUBLICATIONS

International Search Report for PCT/EP2009/055279 dated Feb. 12, 2010.
(Continued)

*Primary Examiner* — Khai M Nguyen
(74) *Attorney, Agent, or Firm* — Sughrue Mion, PLLC

(57) ABSTRACT

In order to minimize noise and current consumption in a hearing aid, an input converter including a first voltage transformer and an analog-to-digital converter of the delta-sigma type for a hearing aid is devised. The analog-to-digital converter of the input converter has an input stage, an output stage, and a feedback loop, and the input stage includes an amplifier ($Q_A$) and an integrator (RLF). The first voltage transformer (IT) has a transformation ratio such that it provides an output voltage larger than the input voltage and is placed in the input converter upstream of the input stage. A second voltage transformer (OT) having a transformation ratio such that it provides an output voltage larger than the input voltage, is optionally placed in the feedback loop of the converter. The voltage transformers (IT, OT) are switched-capacitor voltage transformers, each transformer (IT, OT) having at least two capacitors ($C_a$, $C_b$, $C_c$, $C_d$). The invention further provides a method of converting an analog signal.

29 Claims, 6 Drawing Sheets

(51) Int. Cl.
*H04R 25/00* (2006.01)
*H03M 1/12* (2006.01)

(56) References Cited

U.S. PATENT DOCUMENTS

| | | | |
|---|---|---|---|
| 6,037,887 | A | 3/2000 | Wu et al. |
| 6,473,018 | B2 | 10/2002 | Ueno et al. |
| 7,489,263 | B1 | 2/2009 | Drakshapalli et al. |
| 7,492,296 | B1 * | 2/2009 | Drakshapalli et al. ........ 341/139 |
| 8,330,436 | B2 | 12/2012 | Oraw et al. |
| 8,344,923 | B1 | 1/2013 | Cripe |
| 2007/0120715 | A1 | 5/2007 | Zierhofer |

OTHER PUBLICATIONS

"Max660 Switched Capacitor Voltage Converter", Nov. 1999, Texas Instruments (Literature Number: SN0S405).

Oded Abutbul et al, IEEE Step-Up Switching-Mode Converter With High Voltage Gain Using a Switched-Capacitor Circuit; IEEE Transactions on Circuits and Systems—I: Fundamental Theory and Applications, vol. 50, No. 8, Aug. 2003; pp. 1098-1102.

* cited by examiner

INPUT CONVERTER FOR A HEARING AID AND SIGNAL CONVERSION METHOD

RELATED APPLICATIONS

This application is a Divisional of U.S. application Ser. No. 13/242,719 filed Sep. 23, 2011, which application is a continuation-in-part of application No. PCT/EP2009055279, filed on Apr. 30, 2009, in Europe and published as WO2010/124737 A1, the disclosures of which are incorporated by reference in their entirety.

BACKGROUND OF THE INVENTION

1. Field of the Invention

The present invention relates to hearing aids. The invention, more specifically, relates to analog-to-digital input signal converters in digital hearing aids. The invention further relates to a method of converting an analog signal to a digital signal in a hearing aid.

An analog-to-digital converter, denoted an A/D converter in the following, converts a varying current or voltage into a digital data format. Several different A/D converter topologies exist, each having benefits and tradeoffs in terms of conversion speed, accuracy, quantization noise, current consumption, word length, linearity and circuit complexity. In contemporary, digital hearing aid designs, the delta-sigma A/D converter type is the preferred converter type due to a number of important factors such as easy aliasing filter implementation, conversion noise being controllable by design, comparatively low power consumption and relatively easy implementation due to a low component count when compared to existing A/D converter designs.

By definition, noise inherent in a signal processing device is unwanted signals introduced by the signal processing device itself. Inherent noise may e.g. originate from inadequate operating conditions, poor design or variations in component values. These circumstances have to be taken into account in designing the signal processing device. In A/D converters, several different types of noise may be observed. Among these are conversion noise, quantization noise, thermal noise, flicker noise, recombination noise, and noise due to various physical limitations in the gain-producing elements. In order to provide a distinction between the sources of these different noise types, the most important noise types will be discussed briefly in the following.

Quantization noise originates from the process of quantifying a continuous input voltage span into a finite set of voltage levels that may be represented by discrete, binary levels according to the expression:

$$L_N = 2^n$$

where $L_N$ is the number of discrete levels possible and n is the number of bits used to represent a single sample in the digital domain. Quantization noise may be thought of as the difference between the actual input voltage of a single sample and the discrete voltage used to represent it. This type of noise may thus be minimized, e.g. by increasing the number of bits representing the signal arbitrarily, and will therefore not be discussed further here.

Thermal noise originates from the random Brownian motion of electrons in a resistive medium. Given a resistance, a bandwidth and a temperature, the rms thermal noise $V_{nt}$ is given by:

$$V_{nt} = \sqrt{4k_b T \Delta f R}$$

where $k_b$ is Boltzmann's constant, $1.38065 \times 10^{-23}$ J/K, T the absolute temperature in K, $\Delta f$ the bandwidth of interest in Hz and R the resistance in $\Omega$ of the circuit element considered.

Flicker noise, or 1/f noise, is predominant in the noise spectrum at low frequencies. It has been observed in electronic devices since the era of vacuum tubes, and is also present in contemporary semiconductor devices.

Shot noise is the result of stochastic phenomena caused by an electric current crossing a potential barrier, such as the barrier found between P-doped and N-doped material in a semiconductor element. Current shot noise $I_n$ is a temperature-independent quantity, and may be described by the expression:

$$I_n = \sqrt{2qI}$$

where q is the electron charge, $1.602 \times 10^{-19}$ Coulombs, and I the bias current for the semiconductor element. The unit of the spectral density of shot noise is $A/\sqrt{Hz}$.

In order to provide a hearing aid capable of working uninterrupted for several days without a need for replacing the battery, one design goal for the hearing aid is that the current drawn from the battery by the electronic circuit is reduced as much as possible, preferably to a value below 1 mA. A semiconductor element providing amplification in the order of between one hundred times to perhaps a thousand times the signal present at its input uses a considerable percentage of this current as its bias current in order to handle the large gain within its operating limits. From the foregoing it is evident that shot noise is dependent on the current flowing through the semiconductor element, this fact providing further motivation for reducing the bias current for the amplifier in the A/D converter as much as possible.

2. The Prior Art

Delta-sigma A/D converters are well known in the art. Their purpose is to convert a varying, analog input voltage into a binary bit stream for further processing in the digital domain. Delta-sigma A/D converters have significant advantages over other A/D converter designs. They have a relatively low component count, and they feature various signal processing advantages above other A/D converter designs. In order to reduce conversion noise, oversampling is used. By measuring each discrete voltage many times, e.g. 64, errors due to statistical variations in the input signal are leveled out, and the conversion noise spectrum is pushed far beyond the Nyquist limit, thus making conversion noise very easy to filter out from the signal. One drawback is that the converter clock rate in this example has to be 64 times the desired sample clock rate.

In its essence, a delta-sigma A/D converter comprises a delta-sigma modulator and a low-pass filter. This may be made with an integrator, a comparator and a D-flip-flop. The output signal of the flip-flop is fed back through a feedback loop comprising a one-bit D/A converter, and is subtracted from the input signal upstream of the integrator. The subtracted feedback signal provides an error signal to the input of the delta-sigma modulator.

The error signal from the feedback loop of the A/D converter is used to ensure that, on average, the output signal level of the converter is always equal to the input signal level. If no signal is present on the converter input, a symmetric output bit stream of binary ones and zeroes is generated by the A/D converter. When the input signal voltage changes to a more positive voltage, more binary ones will be present in the output bit stream, and when the input signal voltage changes to a more negative voltage, more binary zeroes will be present in the output bit stream. The delta-sigma A/D converter thus converts an analog input signal into a balance between ones and zeroes in the output bit stream.

SUMMARY OF THE INVENTION

The invention, in a first aspect, provides an input converter for a hearing aid, said converter comprising a first voltage transformer and an analog-to-digital converter of the delta-sigma type, the analog-to-digital converter having an input stage and an output stage, a connection from the output of the input stage to the input of the output stage, and a feedback loop between the input of the input stage and the output of the output stage, said input stage comprising an amplifier and an integrator, wherein the first voltage transformer has a transformation ratio such that it provides an output voltage larger than the input voltage and is placed in the input converter upstream of the input stage.

The invention, in a second aspect, provides a method of converting an analog signal into a digital signal in a hearing aid comprising a digital signal processor, a sampling clock generator and a system clock generator, said method comprising the steps of transforming an input signal voltage, amplifying the transformed input signal voltage, integrating the transformed, amplified voltage, digitizing the amplified, integrated voltage, transforming the digitized, integrated voltage into a higher voltage, subtracting the transformed, digitized voltage from the transformed input voltage, and using the digitized, integrated voltage for generating a digital output bit stream representing the input signal voltage to subsequent stages of the digital signal processor in the hearing aid.

In order to overcome the above shortcomings, the input converter according to the invention comprises a first voltage transformer placed in the input converter upstream of the input stage and having a transformation ratio such that it provides an output voltage larger than the input voltage. When the input signal voltage is transformed up prior to being amplified by the amplifier stage, less amplification is needed in order to bring the input signal up to an acceptable level, and the relative amplifier noise contribution to the amplified signal is lower, and the same is the case when the feedback signal voltage is transformed up prior to being presented to the amplifier input.

According to the invention, both the input transformer and the feedback transformer are implemented as voltage transformers. Voltage transformers are easily implemented in synchronized (clock-controlled) digital networks, and may be designed so as to optimize their impedance to the impedance of the amplifier and the subsequent stages of the A/D converter.

Further features and advantages are evident from the dependent claims.

BRIEF DESCRIPTION OF THE DRAWINGS

The invention will now be described in further detail with respect to the drawings, where.

DETAILED DESCRIPTION OF THE INVENTION

Figure 1:
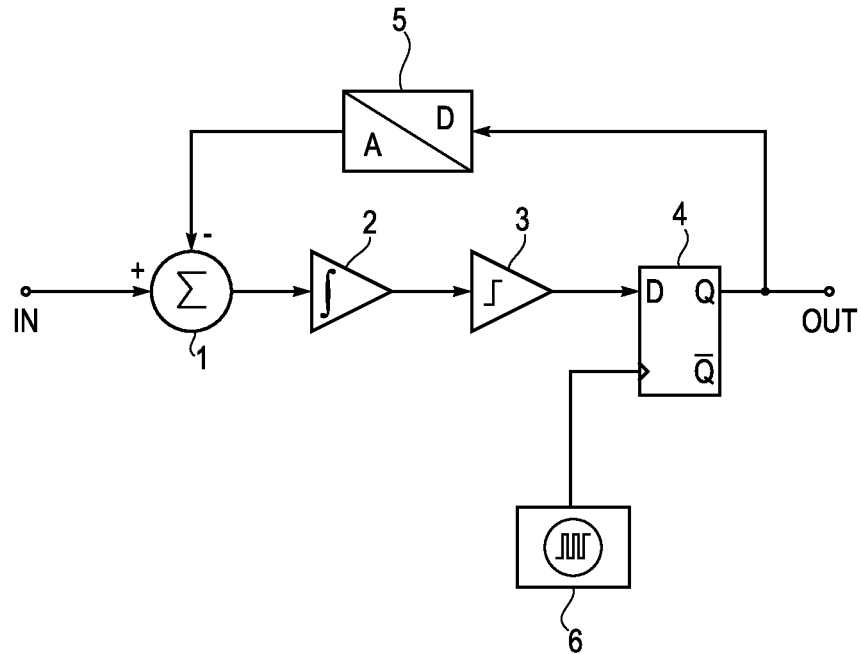
FIG. 1 is a schematic of a prior art delta-sigma A/D converter.

FIG. 1 shows a block schematic of a prior art delta-sigma A/D converter comprising an input terminal IN, a subtraction point 1, an integrator 2, a comparator 3, a D-flip-flop 4, a 1-bit digital-analog converter 5, a clock generator 6, and an output terminal OUT. An analog signal presented to the input terminal IN is fed to the subtraction point 1 where the output signal from the 1-bit D/A converter 5 is subtracted from the input signal, generating an error signal. The difference signal from the subtraction point 1 is fed to the input of the integrator 2 for generating an integral of the difference signal from the subtraction point 1. The output signal from the integrator 2 is presented to the input of the comparator 3 for generating a logical "one"-level whenever the integral signal exceeds a predetermined threshold limit set by the comparator 3, and a logical "zero"-level whenever the output signal from the integrator 2 falls below the predetermined threshold. This logical signal then feeds the data input of the flip-flop 4.

The clock generator 6 controls the flip-flop 4 in such a way that the output signal from the comparator 3 is quantized in time and synchronized to the clock signal, the flip-flop 4 working as a latch, thus creating a bit stream representing the input signal. The bit stream from the output of the flip-flop 4 is split between the output terminal OUT and the input of the 1-bit D/A converter 5 to the subtraction point 1 and subtracted from the input signal. The 1-bit D/A converter 5 converts the logical ones and zeroes in the bit stream into a positive or negative voltage with respect to the input signal for subtraction from the input signal in the subtraction point 1.

This arrangement, in essence, creates a feedback loop, making the bit stream represent the changes in the input signal over time, i.e. when the input signal level is zero, an equal number of digital ones and zeroes will be present in the bit stream; whenever the input signal goes positive, more ones than zeroes will be present in the bit stream in a proportion to the input signal level; and whenever the signal goes negative, more zeroes than ones will be present in the bit stream in a proportion to the input signal level. The bit stream may then be converted into a suitable, digital format for further processing in the digital domain.

A delta-sigma A/D converter design for a hearing aid should have a small noise figure and a low current consumption. However, if the current consumption of the input amplifier of the A/D converter is decreased without any alterations to the design, the noise figure of the amplifier will increase correspondingly. This problem, and a possible solution, will be explained in further detail in the following.

Figure 2:
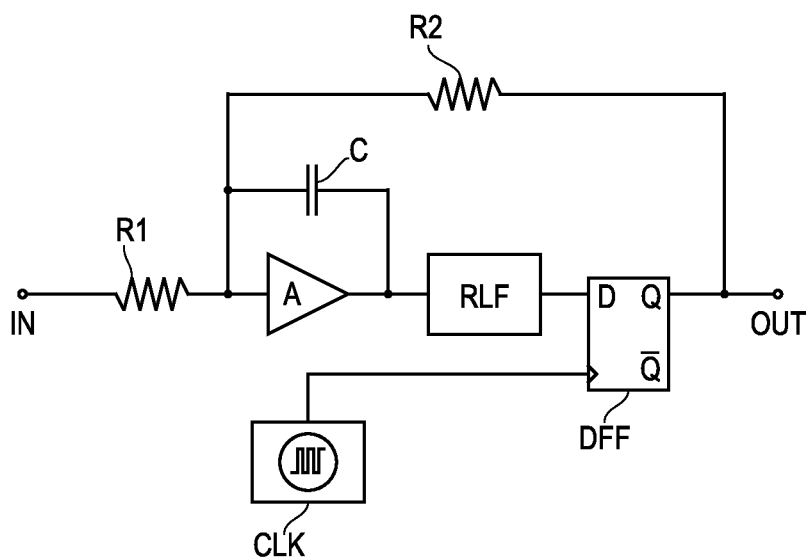
FIG. 2 is a more detailed schematic of the prior art delta-sigma converter in FIG. 1.

FIG. 2 shows a more detailed schematic of a prior art delta-sigma A/D converter. The converter comprises an input IN, a first resistor R1, a second resistor R2, an amplifier A, a capacitor $C_s$ a residual loop filter RLF, a D-flip-flop DFF, and a clock generator CLK generating a clock signal. The amplifier A and the capacitor C forms the integrator 2 of the converter topology shown in FIG. 1, and the residual loop filter RLF comprises subsequent low-pass filter stages present in second- or higher-order delta-sigma converters. The converter receives an analog input signal in the form of a voltage U at the input terminal IN and presents a bit stream representing a digital output signal Y at the output terminal OUT. It should be noted that the signals in the converter are time-continuous until the generation of the bit stream from the output Q of the flip-flop DFF.

The amplifier A and the residual loop filter RLF comprises the loop filter of the converter, and the frequency transfer function of the loop filter, i.e. the frequency transfer function of both A and RLF, determines the converter's ability to suppress frequency-dependent quantization noise. The gain of the amplifier A also suppresses the noise from the filter RLF because the filter RLF is positioned in the feedback loop of the converter. In this discussion, the reason for distinguishing between the amplifier loop filter, respectively, is to isolate the noise contribution from the amplifier A from other noise sources in the feedback loop. All other things being equal, the noise level of the amplifier A thus constitutes the main noise component of the converter apart from quantization noise. This is the reason that the contribution from this particular noise source should be minimized, as mentioned in the foregoing.

If the amplifier A were to have infinite gain, the signal level on the input terminal of the amplifier would be zero. Instead it may be assumed that the total gain of A and RLF combined is sufficiently large throughout the desired frequency bandwidth of the converter for the converter quantization noise to be neglected. Given an input voltage U and a resulting output voltage Y, the transfer function H of the complete converter in FIG. 2 in the ideal case may thus be estimated as:

$$H = \frac{Y}{U} = \frac{-R2}{R1}$$

In order to address the problem of the noise contribution from the input stage of the converter, this particular noise source has to be isolated. This is illustrated in the schematic in FIG. 3.

Figure 3:
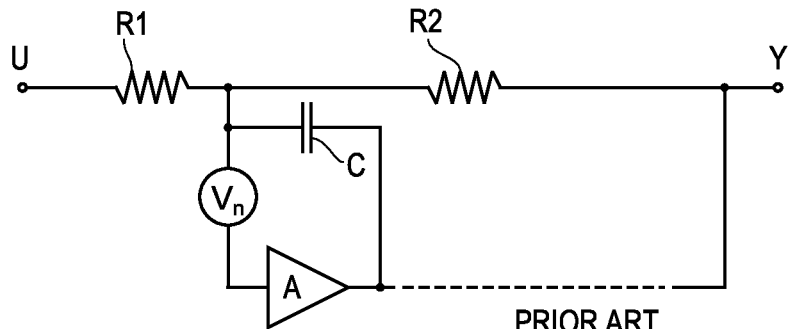
FIG. 3 is an equivalent schematic illustrating the noise level voltage $V_n$ of an amplifier of the delta-sigma converter in FIG. 2.

In FIG. 3, an ideal, noise-free amplifier A and a noise voltage source $V_n$ is substituting the amplifier A in FIG. 2, and the configuration of $C_s$, R1, R2 and A is sketched out together with the input voltage U, the output voltage Y, and the amplifier noise voltage source $V_n$, while the remaining components from FIG. 2 are left out from the schematic for clarity. If the total amplification from A and RLF (not shown in FIG. 3) is assumed to be sufficient for the desired bandwidth of the converter, the noise contribution $Y_n$ to the output voltage Y may be written as:

$$Y_n = \left(1 + \frac{R2}{R1}\right) \cdot V_n$$

The noise voltage contribution $U_n$ with reference to the input voltage U may then be calculated by combining the two expressions thus:

$$U_n = \frac{Y_n}{H} = -\left(1 + \frac{R1}{R2}\right) \cdot V_n$$

This implies that the input noise $U_n$ is dependent on the amplifier noise $V_n$. In other words, if it is possible to decrease $V_n$, the input noise $U_n$ will decrease, too.

The amplifier noise voltage $V_n$ has three primary origins. Noise due to the fact that the amplifier A has finite gain, intermodulation products originating from nonlinearities in the amplifier A, and thermal noise produced by the input stage of the amplifier A. Multi-stage amplifiers with large gain values have traditionally been used in order to minimize thermal noise. Likewise, noise may also be reduced by supplying the semiconductor elements in the amplifier with sufficiently large currents in order to keep the total noise in the output signal at an acceptable level.

However, none of these approaches are especially attractive in a converter design for a hearing aid, where current consumption and component count has to be kept to a minimum in order to prolong battery life. An alternative way of reducing the noise sensitivity of the amplifier in the converter is thus desired.

In theory, the noise voltage $V_n$ may be downscaled, e.g. by transforming the input signal U and the output signal Y by placing ideal transformers between the input terminal U and R1 and between the output terminal and R2 with a given transformation factor N.

Figure 4:
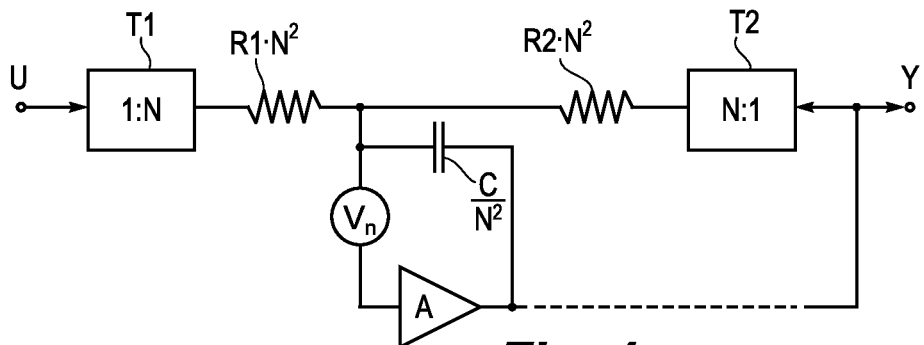
FIG. 4 is a schematic illustrating the principle of equivalent transformation of the input signal to the amplifier in FIG. 3.

FIG. 4 shows an equivalent schematic of the converter in FIG. 3 as modified by the incorporation of ideal transformers T1 and T2 in the input branch and the output branch of the converter, respectively. The input transformer T1 transforms the input voltage by the ratio 1:N, (i.e. the voltage on the transformer output is N times the voltage on the transformer input), and the feedback transformer T2 transforms the feedback voltage by the ratio 1:N (i.e. the voltage presented to the amplifier is N times the voltage present at the output node Y). The values of the resistors R1 and R2 are each scaled with a factor of $N^2$ in order to preserve the current load of the input and the output, respectively. Likewise, the value of the integrator capacitor C is scaled by the factor $N^{-2}$. It may be shown that the resulting amplifier noise voltage $V_n$ is scaled correspondingly by the factor $V_n/N$. In theory, it is possible to scale the noise contribution from the amplifier stage down by an arbitrary amount, providing the amplifier stage is capable of handling the increased input voltage without being saturated. The current demands for the converter are also smaller due to the impedance transformation.

Real transformers are non-ideal and therefore impossible to use in practical hearing aids due to their size, weight, current consumption and power losses. The inventor has realized that the equivalent of an ideal transformer may be applied as a solution to the problem with satisfactory results. Such an equivalent is described in further detail in the following. The starting point of this discussion is a delta-sigma A/D converter utilizing a topology based on sampled capacitors. Sampled-capacitor stages are considered to be well-known in the art, and the working principle of such a sampled-capacitor A/D converter is described in further detail in the following with reference to FIG. 5 and FIG. 6.

Figure 5:
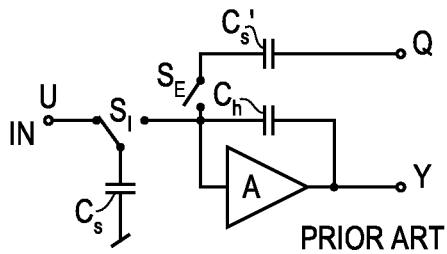
FIG. 5 is a schematic illustrating a first phase of a prior art sampled capacitor integrator.

FIG. 5 is a schematic illustrating a first phase of a sampling clock control signal in a prior art sampled-capacitor delta-sigma A/D converter comprising an input terminal U, a first sampling capacitor $C_s$, a first switch $S_I$, a second switch $S_E$, a hold capacitor $C_h$, an amplifier A, a feedback loop capacitor $C_s'$, a feedback loop terminal Q and an output terminal Y. The feedback loop terminal Q carries the feedback signal from the output of the D-flip-flop (not shown). The switches $S_I$ and $S_E$ are controlled by a sampling clock (not shown). In a first phase of the sampling clock control signal, shown in FIG. 5, the sampling capacitor $C_s$ is charged by the input voltage presented on the input terminal U during a first, specific period of time, via the switch $S_I$. The second switch $S_E$ is open in the first phase.

Figure 6:
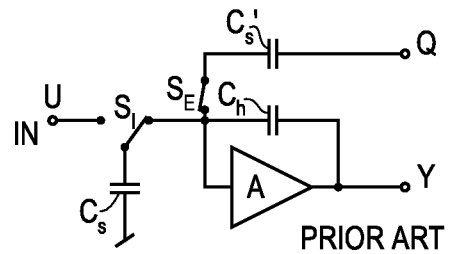
FIG. 6 is a schematic illustrating a second phase of a prior art sampled capacitor integrator.

In a second phase of the sampling clock control signal, shown in the schematic in FIG. 6, the switch $S_I$ disconnects the sampling capacitor $C_s$ from the input terminal U and connects it to the input of the amplifier A and the hold capacitor $C_h$, whereby the sampling capacitor $C_s$ is discharged for a second, specific period of time via the switch $S_I$, transferring its charge to the hold capacitor $C_h$. The switch $S_E$ is closed in the second phase, and connects the feedback loop capacitor $C_s'$ to the input of the amplifier A. The voltage on the input terminal of the amplifier A is now equal to the voltage on the input terminal U during the first period of time minus the error voltage present on the feedback terminal Q. When the second phase ends, the switches $S_I$ and $S_E$ are returned to their initial positions shown in FIG. 5, and the process is repeated periodically.

If the position of the switch S is controlled by a periodical signal having the frequency $f_s$, the impedance $Z_s$ of the sample capacitor $C_s$ may be described as:

$$Z_h = \frac{1}{(C_s \cdot f_s)}$$

Figure 7:
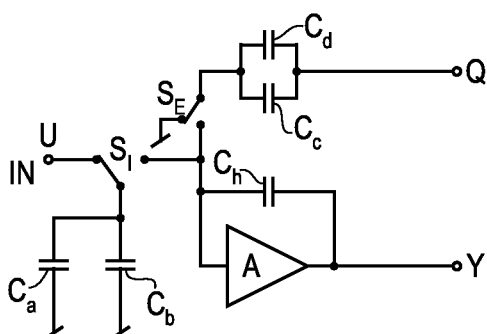
FIG. 7 is a schematic illustrating a first phase of the sampled capacitor integrator according to an embodiment of the invention.

Consider the sampling capacitor $C_s$ of the sampled-capacitor delta-sigma A/D converter in the first phase shown in FIG. 5 split into two capacitors, each having a capacitance of $C_s/2$. A voltage transformation may then be implemented by changing the sampled-capacitor design to look like the schematic in FIG. 7 and FIG. 8, respectively. The sampled-capacitor circuit design shown in FIG. 7 and FIG. 8 comprises two controlled switches $S_I$ and $S_E$, an amplifier A, a hold capacitor $C_h$, and four capacitors $C_a$ and $C_b$, $C_c$ and $C_d$, each of the four capacitors having a capacitance of $C_s/2$. In FIG. 7, the switch $S_I$ connects the two capacitors $C_a$ and $C_b$ to the input terminal IN in parallel in the first phase, in a manner similar to that shown in FIG. 5, and in FIG. 8, the switch $S_I$ connects the two capacitors $C_a$ and $C_b$ to the amplifier A in series in the second phase in a manner similar to that shown in FIG. 6.

Figure 8:
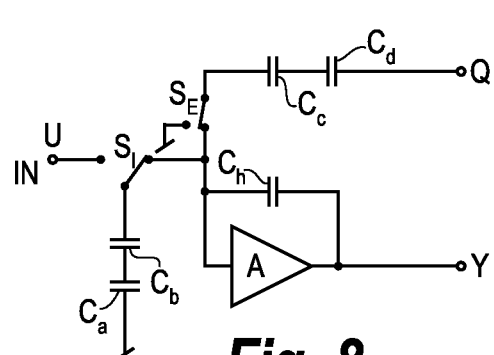
FIG. 8 is a schematic illustrating a second phase of the sampled capacitor integrator according to an embodiment of the invention.

Likewise, the feedback capacitors $C_c$ and $C_d$ are charged in parallel to the voltage present on the feedback loop terminal Q with reference to ground via the switch $S_E$ in the first phase in FIG. 7, and in the second phase, shown in FIG. 8, the feedback capacitors $C_c$ and $C_d$ are connected in series between the feedback loop terminal Q and the amplifier A via the switch $S_E$ during discharge of the feedback capacitors $C_c$ and $C_d$, whereby the voltage drop between the feedback loop terminal Q and the hold capacitor $C_h$ is doubled. The voltage present at the input of the amplifier A in the second phase is then $V_U$-$V_Q$, i.e. the doubled input voltage minus the doubled feedback voltage.

The effect of this arrangement is that the input node of the amplifier A is isolated from the input terminal U and the feedback loop terminal Q by the voltage transformers formed by the capacitors $C_a$, $C_b$, $C_c$ and $C_d$, respectively. The net result of doubling the input voltage and the feedback loop voltage is that the intrinsic noise level $V_n$ of the amplifier A becomes comparatively smaller, and the signal-to-noise ratio thus is improved, while maintaining both the input impedance and the output impedance of the amplifier stage A as seen from outside the circuit shown in FIG. 7 and FIG. 8, respectively.

With the capacitors $C_a$, $C_b$, $C_c$ and $C_d$ having values of $C_s/2$, respectively, this configuration is equivalent to a voltage transformation with a transformation factor of 1:2 for the input transformer, respectively 2:1 for the feedback transformer, as the impedance $Z_s$ of the hold capacitor $C_s$ now becomes:

$$Z_s = \frac{4}{(C_s \cdot f_s)}$$

This arrangement thus effectively quadruples the input impedance of the amplifier A. By changing the configuration of the circuit in synchronization with the two phases of the sampling clock frequency $f_s$ of the sampled-capacitor delta-sigma A/D converter, by means of the switches $S_I$ and $S_E$ as shown in FIGS. 7 and 8, the input voltage U presented to the input terminal of the amplifier A is then doubled to 2U.

Consider the amplifier A having unity gain, and an error signal of 0 V being present on the feedback loop terminal Q. Then the output signal downstream of the second voltage transformer $C_c$ and $C_d$ is:

$$\frac{2 \cdot U + V_n}{2} = U + \frac{V_n}{2}$$

This is based on the imperative that the capacitors $C_c$ and $C_d$ are shifted between the parallel configuration in the first phase shown in FIG. 7 and the serial configuration in the second phase shown in FIG. 8. By isolating the input of the amplifier A of the input stage of the A/D-converter from the rest of the circuitry with first and second voltage transformers in this way, an effective, comparative noise figure of $V_n/2$ may be obtained in a simple and effective manner.

Figure 9:
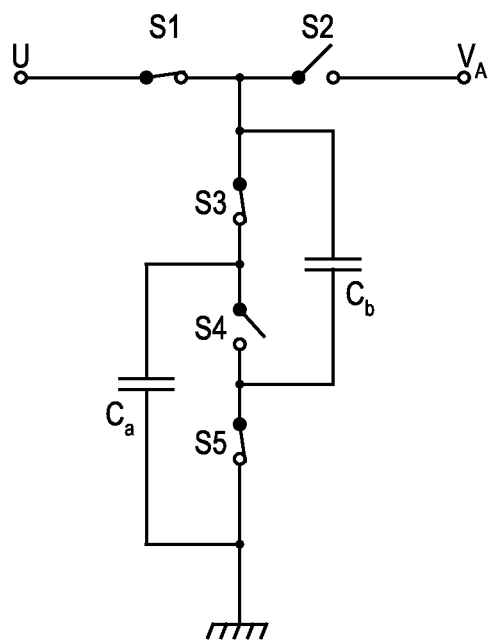
FIG. 9 is a schematic of an implementation of an input transformer in a first phase according to an embodiment of the invention.
Figure 10:
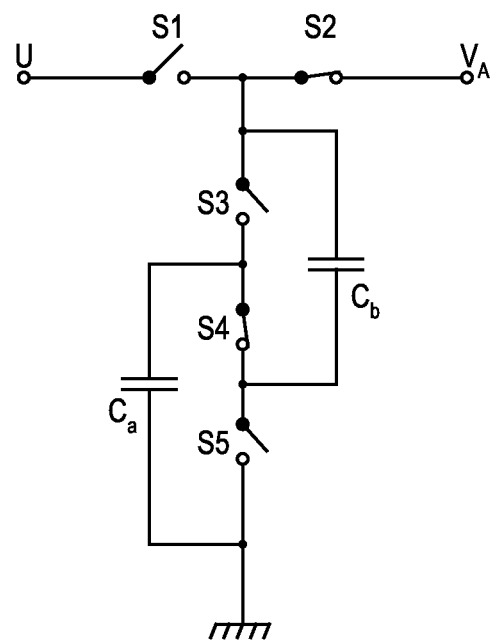
FIG. 10 is a schematic of an implementation of an input transformer in a second phase according to an embodiment of the invention.

A schematic illustrating a first and a second phase of the function of the input voltage transformer circuit of FIGS. 7 and 8 is described in the following with reference to FIG. 9 and FIG. 10. In FIG. 9 and FIG. 10, a voltage transformer circuit comprises an input terminal U, an output terminal $V_A$, five controlled switches S1, S2, S3, S4, and S5, and two sampling capacitors $C_a$ and $C_b$, both having a capacitance of $C_s/2$ with respect to the schematic of the circuit shown in FIGS. 5 and 6. The output terminal $V_A$ of the voltage transformer circuit is to be connected to an amplifier (not shown) as illustrated in FIGS. 7 and 8.

In the first phase of the voltage transformer, shown in FIG. 9, the switches S1, S3, and S5 are closed, and the switches S2 and S4 are open. The two capacitors are thus connected in parallel to the input terminal U in FIG. 9. A voltage present on the input terminal U will thus charge the capacitors $C_a$ and $C_b$ to the same voltage.

In the second phase of the voltage transformer, shown in FIG. 10, the switches S1, S3, and S5 are now open, and the switches S2 and S4 are now closed. The two capacitors $C_a$ and $C_b$ are now connected in series, thus doubling their total charge voltage while reducing the total capacitance to CA, and connected to the output terminal $V_A$. The combined charge collected by the capacitors $C_a$ and $C_b$ is now presented as a voltage to the output terminal $V_A$. This voltage is double the voltage of U due to the altered configuration of the capacitors $C_a$ and $C_b$.

Consider the output terminal $V_A$ of the input voltage transformer shown in FIG. 9 and FIG. 10 connected to the input stage of an amplifier A in the way shown in FIG. 7 and FIG. 8. If the amplifier A has an amplification gain β, then the input voltage U is both doubled and multiplied by β, but the noise voltage $V_n$ is just multiplied by β. For a given input voltage U, the voltage output $V_Y$ from the amplifier A will be:

$$V_Y = 2 \cdot \beta \cdot U + \beta \cdot V_n \Leftrightarrow V_Y = \beta(2 \cdot U + V_n)$$

The noise voltage contribution $V_n$ to the output voltage $V_Y$ is then half the noise voltage contribution of the untransformed input voltage in this case, provided that the amplifier is capable of handling the transformed input voltage of 2U.

The voltage contribution from the feedback loop signal of the delta-sigma A/D converter is doubled in a similar way by the second voltage transformer $C_c$ and $C_d$ as indicated in FIG. 7 and FIG. 8.

The principle of voltage transformation is extensible to an arbitrary number N of sampling capacitors each having the capacitance of $C_s/N$, in effect reducing the apparent noise figure of the amplifier equally to $V_n/N$. It is not essential for operation of the invention that the input transformer and the feedback transformer have the same transformation ratio. This principle permits implementation of the input amplifier in a much simpler way due to the reduced demands on its performance with regard to amplification gain, thermal noise, intermodulation noise, and errors due to finite gain of the amplifier.

The amplifier in the input stage of the A/D converter according to the invention may consequently be implemented as a simple, single-stage amplifier comprising one single semiconductor element, such as a BJT, FET, or other amplifying element having sufficient gain. Single-stage amplifiers inherently have a very attractive relationship between thermal voltage noise and current consumption. The voltage transformation further reduces the bias current demands of the amplifier and thus the current consumption of the complete A/D converter, of which the bias current for the input amplifier constitutes a substantial part.

Figure 11:
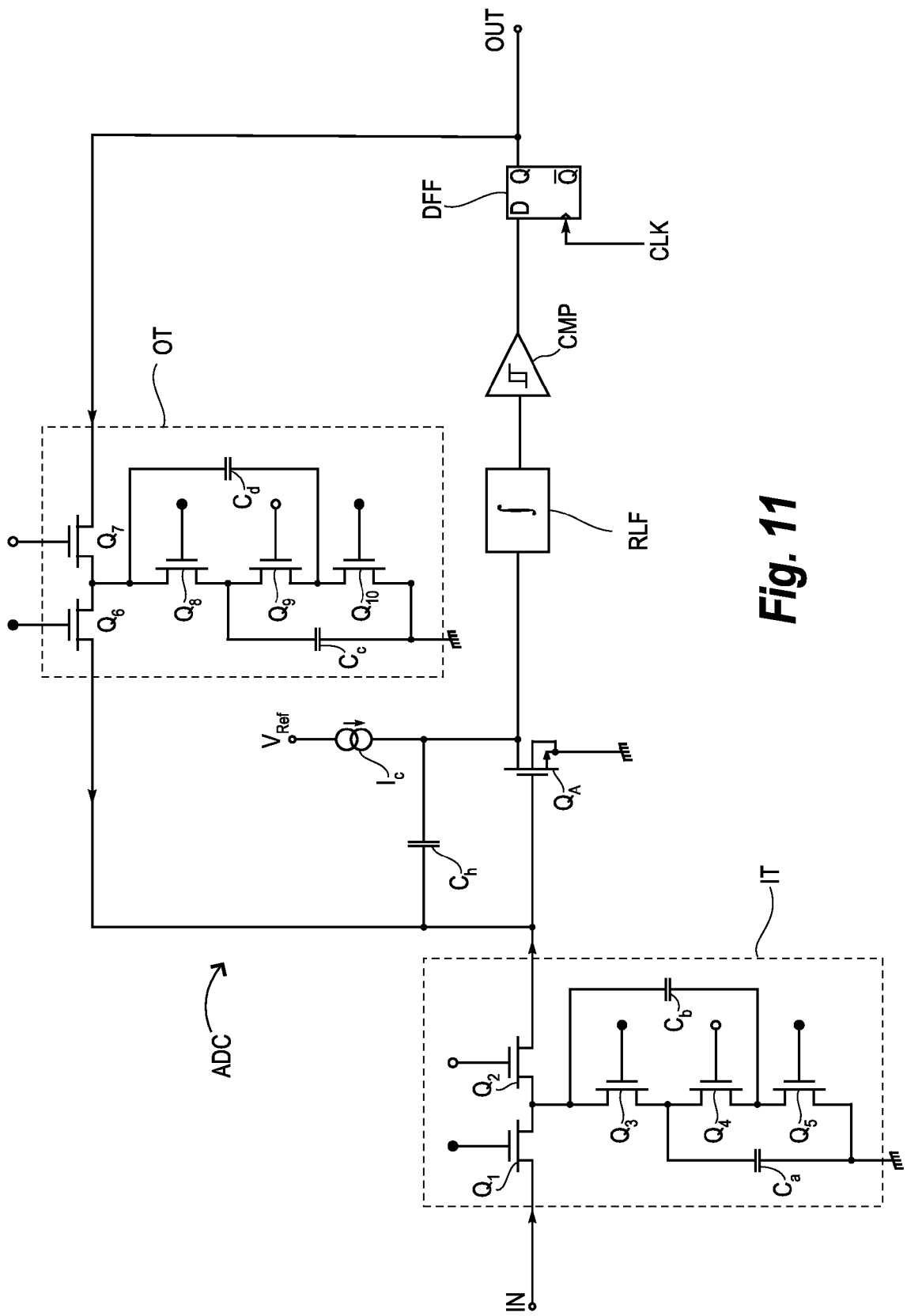
FIG. 11 is a schematic of a delta-sigma analog-to-digital converter according to an embodiment of the invention.

FIG. 11 shows a delta-sigma A/D converter ADC according to the invention. The A/D converter ADC comprises an input terminal IN, an input transformer stage IT, an amplifier stage $Q_A$, a hold capacitor $C_h$, a constant current generator $I_c$, a feedback transformer stage OT, a residual loop filter RLF, a comparator CMP, a flip-flop DFF, and an output terminal OUT. The flip-flop DFF is controlled by a system clock source (not shown). The amplifier stage $Q_A$ is fed a constant current from the constant current source $I_c$ powered by a connection to the reference voltage source $V_{ref}$. This current controls the operating point of the amplifier $Q_A$ in order for it to be able to provide the desired gain to the input signal.

The input transformer stage IT comprises switching transistors $Q_1, Q_2, Q_3, Q_4$, and $Q_5$, and capacitors $C_a$ and $C_b$. The feedback transformer stage OT comprises switching transistors $Q_6, Q_7, Q_8, Q_9$ and $Q_{10}$, and capacitors $C_c$ and $C_d$. For simplicity, these four capacitors are considered to be of equal capacitance, i.e. $C_a = C_b = C_c = C_d$.

The switching transistors $Q_1, Q_2, Q_3, Q_4$ and $Q_5$ of the input transformer stage IT are controlled by a sampling clock generator (not shown) in such a manner that when the signal edge of the sampling clock generator goes positive in a first phase, the switching transistors $Q_1, Q_3$, and $Q_5$ close (i.e. they allow an electrical current to pass), and $Q_2$ and $Q_4$ open (i.e. they block an electrical current). This is illustrated in FIG. 11 by an open or a filled circle, respectively, on the base terminal of the respective switching transistors. In the first phase of the signal edge of the sampling clock generator, a filled circle denotes a closed transistor and an open circle denotes an open transistor.

When the signal edge of the sampling clock generator goes negative in a second phase, the switching transistors $Q_1, Q_3$, and $Q_5$ of the input transformer IT open, and the switching transistors $Q_2$ and $Q_4$ close. In the second phase of the signal edge of the sampling clock generator, an open circle denotes a closed transistor and a filled circle denotes an open transistor. This configuration is equivalent to the schematics shown in FIGS. 9 and 10, respectively, where the transistors $Q_1, Q_2, Q_3, Q_4$, and $Q_5$ substitute the switches S1, S2, S3, S4, and S5, respectively, retaining the essential function of the circuit shown in FIGS. 9 and 10. The clock frequency of the sampling clock generator (not shown) is of the magnitude of 30 kHz, and the clock frequency of the system clock generator (not shown) is of the magnitude 1-2 MHz. This gives an oversampling ratio of the converter of from 30 to 60 times oversampling.

In the first phase, where $Q_1, Q_3$ and $Q_5$ are closed and $Q_2$ and $Q_4$ are open, the capacitors $C_a$ and $C_b$ are connected in parallel to the input terminal IN, and each capacitor is charged to the voltage present on the input terminal IN. In the second phase, where $Q_1, Q_3$ and $Q_5$ are open and $Q_2$ and $Q_4$ are closed, the capacitors $C_a$ and $C_b$ are connected in series to the input of $Q_A$, delivering their combined charge to the input of $Q_A$ and the hold capacitor $C_h$. Due to this arrangement, the input voltage fed to the input transformer IT will be doubled at its output, as explained above.

The switching transistors $Q_6, Q_7, Q_8, Q_9$ and $Q_{10}$ of the feedback transformer OT are also controlled by the sampling clock generator (not shown) in such a way that when the signal edge of the sampling clock generator goes positive in the first phase, the switching transistors $Q_6, Q_8$ and $Q_{10}$ close and $Q_7$ and $Q_9$ open. This is also illustrated by an open or a filled circle, respectively, on the base terminal of the respective switching transistors, where a filled circle denotes a closed transistor and an open circle denotes an open transistor. This implies that the capacitors $C_c$ and $C_d$ are connected in parallel to the input of the amplifier $Q_A$ in the first phase, delivering their combined charge to the input of the amplifier $Q_A$.

In the second phase, when the signal edge of the sampling clock generator goes negative, the switching transistors $Q_6, Q_8$ and $Q_{10}$ open, and $Q_7$ and $Q_9$ close. In this case, an open circle on the base terminal of the respective transistor denotes a closed transistor and a filled circle denotes an open transistor. This implies that the capacitors $C_c$ and $C_d$ are connected in series to the output terminal OUT in the second phase and charged by the error voltage from the flip-flop DFF. The capacitors $C_c$ and $C_d$ are essentially placed in the feedback loop of the amplifier $Q_A$, doubling the feedback voltage from the output of the flip-flop DFF before presenting the error voltage to the input of the amplifier $Q_A$.

The residual loop filter RLF outputs the integral of the signal from $Q_A$, and the comparator CMP outputs a logical zero value whenever the integral is below a predetermined threshold, and a logical one value whenever the integral is above a predetermined threshold. The flip-flop DFF converts the binary integral signal from the comparator CMP into a bit stream controlled by the clock signal CLK and fed to both the output terminal OUT and the input of the feedback transformer OT as a feedback signal.

By doubling the voltage present at the input of the amplifier $Q_A$ with the voltage transformers IT and OT respectively, the input voltage is increased by a factor two, and the relative noise voltage level $V_n$ is reduced as a consequence without the need for increasing the supply current to the amplifier $Q_A$.

Figure 12:
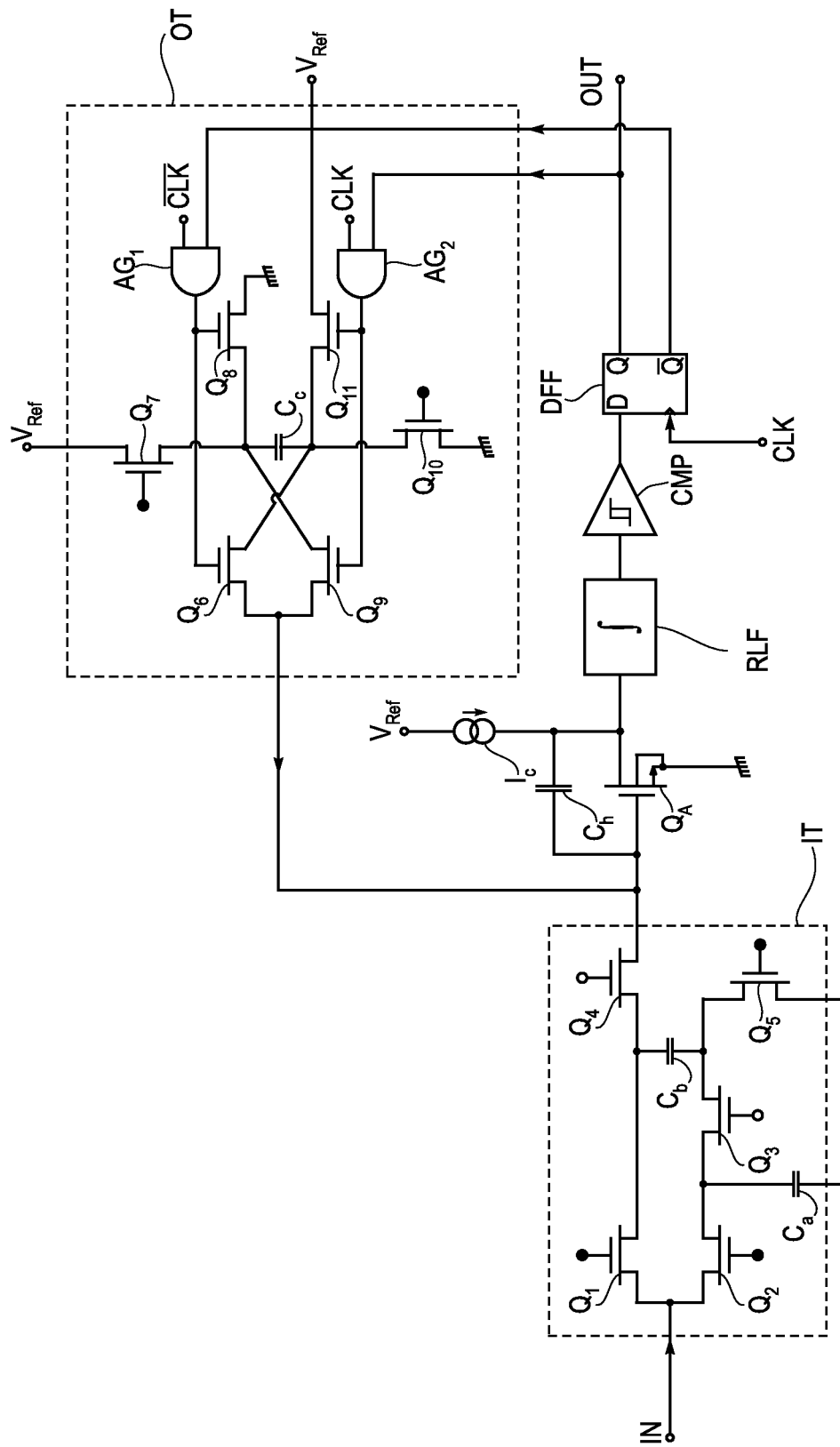
FIG. 12 is a schematic of a preferred embodiment of a delta-sigma analog-to-digital converter according to an embodiment of the invention.

A preferred embodiment of the A/D converter according to the invention is shown in FIG. 12. The general configuration of the input terminal IN, the input transformer IT, the feedback transformer OT, the constant current generator $I_c$, the amplifier $Q_A$, the hold capacitor $C_h$, the residual loop filter RLF, the comparator CMP, the flip-flop DFF, and the output terminal OUT is similar to the configuration shown in FIG. 11, but the topologies of the input transformer IT and the feedback transformer OT differs from the embodiment shown in FIG. 11.

The input transformer IT comprises switching transistors, $Q_1$, $Q_2$, $Q_3$, $Q_4$, and $Q_5$, and capacitors $C_a$ and $C_b$, and the feedback transformer OT comprises switching transistors, $Q_6$, $Q_7$, $Q_8$, $Q_9$, $Q_{10}$, and $Q_{11}$, one capacitor $C_c$, and two AND gates $AG_1$ and $AG_2$. In this preferred embodiment, the feedback transformer OT has one capacitor less than the embodiment shown in FIG. 11.

All the switching transistors of the input transformer IT and some of the switching transistors of the feedback transformer OT are controlled by a sampling clock generator (not shown) in such a way that when the sampling clock signal goes positive in a first phase, the transistors $Q_1$, $Q_2$, $Q_5$, $Q_7$, and $Q_{10}$ close, i.e. they allow an electric current to pass, and the transistors $Q_3$ and $Q_4$ open, i.e. they block an electric current. When the clock signal goes negative, in a second phase, the transistors $Q_1$, $Q_2$, $Q_5$, $Q_7$, and $Q_{10}$ open, and the transistors $Q_3$ and $Q_4$ close.

The switching transistors $Q_6$, $Q_8$, $Q_9$ and $Q_{11}$ are controlled by first and second AND gates $AG_1$ and $AG_2$, respectively. The first AND gate $AG_1$ outputs a logical high level when the logical flip-flop output $\overline{Q}$ is logically high and the inverted system clock signal $\overline{CLK}$ is logically high. The second AND gate AG2 outputs a logically high level when the flip-flop output Q is logically high and the system clock signal CLK is logically high. The logical flip-flop output signals $\overline{Q}$ and Q are mutually exclusive, and $\overline{CLK}$ and CLK are also mutually exclusive, so only one of the two AND gates $AG_1$ and $AG_2$ may output a logically high level at any one time. When a logical zero is present in the bit stream, $AG_1$ is logically high on every negative clock pulse, and when a logical one is present in the bit stream, $AG_2$ is logically high on every positive clock pulse.

When the first AND gate $AG_1$ outputs a logically high level, the switching transistors $Q_6$ and $Q_8$ close, while the switching transistors $Q_9$ and $Q_{11}$ open. This has the effect of the first node of the capacitor $C_c$ being connected to ground through $Q_8$, and the second node of the capacitor $C_c$ being connected to the input of the amplifier $Q_A$, and whatever voltage present on the first node of the capacitor $C_s$ is mirrored as a negative voltage at the input of the amplifier $Q_A$. In the first phase of the sampling period, the switching transistors $Q_7$ and $Q_{10}$ are closed. They provide the voltage $V_{ref}$ to the first node of the capacitor $C_c$, and connects the second node of $C_s$ to ground, while $V_{ref}$ gets added to the voltage already present on the first node of $C_c$. In the second phase of the sampling period, the switching transistors $Q_7$ and $Q_{10}$ are open. The first node of the capacitor $C_c$ is now connected to the output of $AG_1$, and the second node of $C_c$ is connected to the input of the amplifier $Q_A$.

When the second AND gate $AG_2$ outputs a logically high level, the switching transistors $Q_9$ and $Q_{11}$ are closed, while the switching transistors $Q_6$ and $Q_8$ are open. Consequently, the first node of the capacitor $C_c$ is connected to the input of the amplifier $Q_A$, and the second node of the capacitor $C_c$ is connected to $V_{ref}$ through $Q_8$. In the first phase of the sampling period, the switching transistors $Q_7$ and $Q_{10}$ are closed. They provide the voltage $V_{ref}$ to the first node of the capacitor $C_c$, and connect the second node of $C_c$ to ground while $V_{ref}$ gets added to the voltage already present on the first node of $C_c$. In the second phase of the sampling period, the switching transistors $Q_7$ and $Q_{10}$ are open. The first node of the capacitor $C_c$ is now connected to the input of the amplifier $Q_A$, and the second node of $C_c$ is connected to the output of $AG_1$.

The result of this arrangement is that whenever a logical one is present in the bit stream to the output terminal OUT, the voltage contribution from OT is equal to $2V_{ref}$, and whenever a logical zero is present in the bit stream, the voltage contribution from OT is equal to $-V_{ref}$. For a bit stream comprised of an equal number of ones and zeroes, the mean value of the error signal from OT is thus equal to $\frac{1}{2}V_{ref}$.

The delta-sigma A/D converter according to the invention accomplishes two goals at the same time. Firstly, the single-stage input amplifier design implies that the current consumption of the input amplifier may be reduced considerably, and secondly, the signal-to-noise ratio is improved by transforming up the signal level before it reaches the input stage. The application of sample-clock controlled voltage transformers for isolating the input stage from the input and the error feedback loop, respectively, provides the solution to the signal-to-noise ratio problem arising from using a single-stage input amplifier without a significant increase in power consumption. This design is preferred in a battery-powered circuit such as a hearing aid, and as a result, more than one delta-sigma A/D converter may be implemented on the circuit chip comprising the main part of the electronic circuit of a hearing aid.

Figure 13:
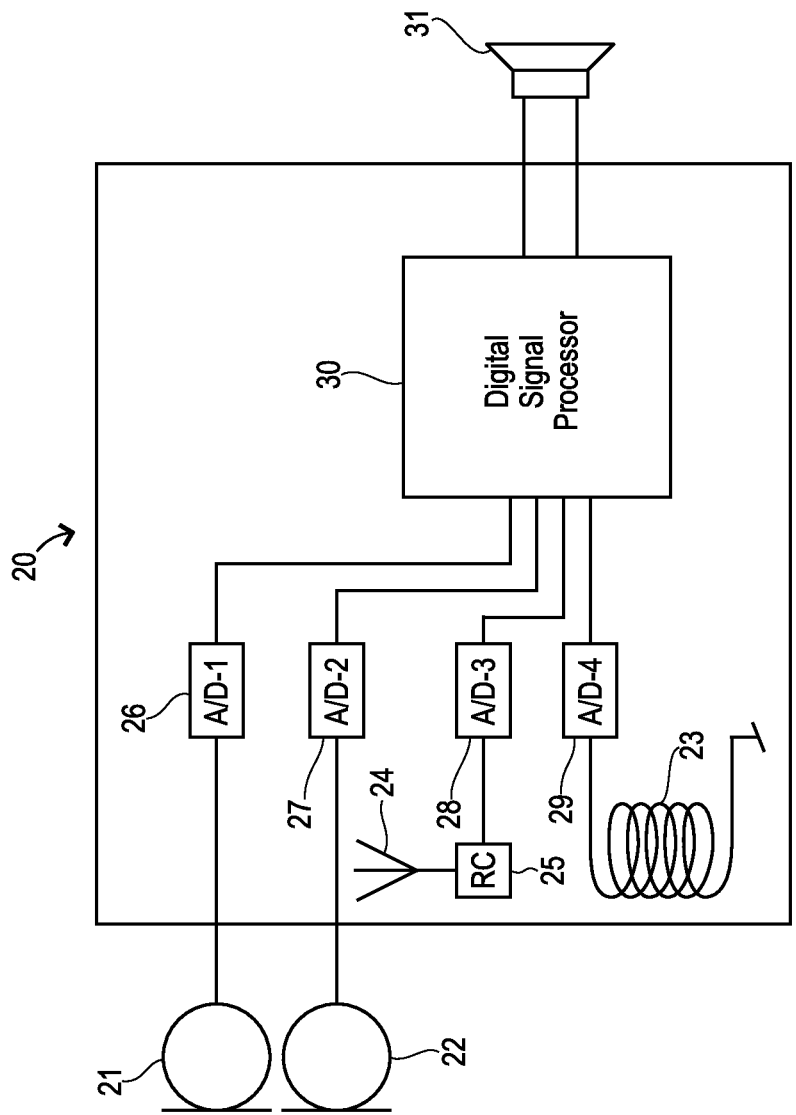
FIG. 13 is a schematic of a hearing aid having four delta-sigma converters according to an embodiment of the invention.

FIG. 13 is a schematic of a hearing aid 20 comprising a plurality of A/D converters according to the invention. The hearing aid 20 comprises a first microphone 21, a second microphone 22, a telecoil 23, an antenna 24, a wireless receiver 25, a first A/D converter 26, a second A/D converter 27, a third A/D converter 28, a fourth A/D converter 29, a digital signal processor 30 and a loudspeaker 31. All the components of the hearing aid 20 are fed from a battery cell (not shown) disposed within the hearing aid.

When in use, the first microphone 21 and the second microphone 22 pick up acoustical signals from the surroundings and convert them into continuously varying electrical signals for use by the hearing aid 20. The continuously varying electrical signal from the first microphone 21 is fed to the first A/D converter 26, which converts the variations in the electrical signal into a first digital bit stream suitable for being processed by the digital signal processor 30. In a similar way, the continuously varying electrical signal from the second microphone 22 is fed to the second A/D converter 27, which converts the variations in the electrical signal into a third digital bit stream suitable for being processed by the digital signal processor 30. As the first and the second A/D converters 26 and 27 are independent entities, they generate individual bit streams for independent processing by the digital signal processor 30.

The digital signal processor 30 may combine the individual bit streams from the first and the second A/D converters 26 and 27, representing the signals from the first and the second microphone 21 and 22, respectively, in such a way that directional information inherent in the acoustical signals picked up by the microphones is retained for processing in the digital signal processor 30 and subsequent reproduction by the speaker 31.

In situations where a suitable wireless signal is available, the wireless receiver 25 may be engaged for receiving and demodulating the wireless signal for reproduction by the hearing aid 20. The wireless signal is received by the antenna 24, demodulated by the wireless receiver 25, and presented as a varying electrical signal to the third A/D converter 28, which converts the variations in the electrical signal into a third digital bit stream suitable for being processed by the digital signal processor 30. The third A/D converter 28 operates independently of the first A/D converter 26 and the second A/D converter 27, and the signal from the wireless receiver 25 may thus be selected even if both the first and the second microphone 21 and 22 are engaged simultaneously.

If the hearing aid user is at a location where a telecoil loop system is present, it may be advantageous to use the signal from the telecoil 23. In this case, signals from the loop system (not shown) is picked up by the telecoil 23 and presented to the input of the fourth A/D converter 29, which converts the variations in the electrical signal into a fourth digital bit stream suitable for being processed by the digital signal processor 30. The fourth A/D converter 29 operates independently of the first, the second and the third A/D converters 26, 27 and 28, respectively, and the signal may be selected even if both the first microphone 21, the second microphone 22, and the wireless receiver 25 are engaged at the same time.

The digital signal processor 30 comprises means (not shown) for selecting up to four individual bit streams from the four A/D converters 26, 27, 28 and 29, respectively. The bit streams are preferably interleaved by the digital signal processor 30 and mutually weighted in order to generate a preferred balance between the signals from the four signal sources feeding the four A/D converters 26, 27, 28 and 29 for reproduction to a hearing aid user.

The digital signal processor 30 performs a series of calculations on the individual bit streams in order to process the digital representations of the audio signals according to an individual prescription for the hearing aid user. The balance between the signals from the four signal sources feeding the four A/D converters 26, 27, 28 and 29 may be determined when fitting the hearing aid to the user, and subsets of different signal source balances may be stored in the hearing aid as programs for later recall by the user.

I claim:

1. A sigma-delta converter converting an analog signal into a digital signal, and comprising:
    an input transformer receiving an input voltage and outputting a transformed voltage to a summation point;
    an integrator integrating a voltage present in the summation point;
    a comparator comparing an output from the integrator with a predetermined threshold and outputting a logical level in accordance with the comparison; and
    a feedback loop coupling a feedback signal back to the summation point;
    wherein said input transformer includes a switchable capacitor configuration.

2. The converter according to claim 1, wherein the input transformer includes at least two capacitors, a plurality of switching elements and control logic, and wherein the control logic switches the input transformer between a first and a second phase of operation.

3. The converter according to claim 2, wherein said plurality of switching elements and control logic is configured to arrange said at least two capacitors in a parallel configuration in said first phase and in a serial configuration in said second phase.

4. The converter according to claim 1, wherein the input transformer has a transformation ratio at 1:N.

5. The converter according to claim 4, wherein the transformation ratio of said input transformer is 1:2.

6. The converter according to claim 1, wherein the output of the comparator is fed to a latch, wherein said latch is controlled by a clock signal and outputs a digital bit stream accordingly, and wherein said latch output is coupled as feedback signal back to the summation point via a feedback loop.

7. The converter according to claim 6, wherein said latch is a D-Flip-Flop.

8. The converter according to claim 6, wherein the feedback loop comprises a feedback transformer receiving an output from said latch and outputting a transformed voltage to the summation point.

9. The converter according to claim 8, wherein the feedback transformer includes at least two capacitors, a plurality of switching elements and control logic, and wherein the control logic switches the feedback transformer between a first and a second phase of operation.

10. The converter according to claim 9, wherein said plurality of switching elements and control logic is configured to arrange said at least two capacitors in a parallel configuration in said first phase and in a serial configuration in said second phase.

11. The converter according to claim 6, wherein the digital output signal is a digital bit stream having a data rate controlled by the clock signal.

12. A method of converting an analog signal into a digital signal, said method comprising the steps of:
    transforming the analog input signal by charging input capacitors connected in a first configuration and then switching the charged input capacitors to a second configuration to produce a transformed input signal; and
    converting said transformed input signal to digital form.

13. A method according to claim 12, wherein said converting step comprises:
    presenting the transformed input signal at a summation point;
    integrating the voltage present at said summation point;
    comparing the integrated voltage with a predetermined threshold and outputting a logical level in accordance with the comparison; and
    coupling a feedback signal back to the summation point.

14. The method according to claim 12, wherein said input capacitors are connected in parallel in said first configuration and in series in said second configuration.

15. The method according to claim 12, wherein the step of transforming the analog input signal involves transforming the input signal voltage into a higher voltage by charging said capacitors in a parallel configuration to an instantaneous value of the input voltage in a first phase of the clock signal and by discharging said capacitors in a serial configuration in a second phase of the clock signal.

16. The method according to claim 13, comprising feeding said logic level to a latch; and controlling said latch with a clock signal for outputting a digital bit stream accordingly; said latch output being coupled as said feedback signal back to the summation point.

17. The method according to claim 16, wherein the step of coupling said latch output to said summation point comprises transforming said latch output to a transformed voltage and presenting the transformed voltage at the summation point.

18. The method according to claim 17, wherein said step of transforming said latch output comprises switching of a capacitor configuration between a parallel configuration in said first phase and a serial configuration in said second phase.

19. The method according to claim 18, wherein the step of transforming said latch output involves transforming the output signal from said latch by charging at least two capacitors in a parallel configuration to an instantaneous value of the latch output voltage in a first phase of the clock signal and by discharging the at least two capacitors in a serial configuration in a second phase of the clock signal.

20. A sigma-delta converter converting an analog signal into a digital signal, and comprising:
an input transformer receiving an input voltage and outputting a transformed voltage to a summation point;
an integrator integrating a voltage present in the summation point;
a comparator comparing the output from the integrator with a predetermined threshold and outputting a logical level in accordance to the comparison; and
a feedback loop coupling a feedback signal back to the summation point;
wherein the input transformer includes at least two capacitors, a plurality of switching elements and control logic, and
wherein said plurality of switching elements and control logic is configured to arrange said at least two capacitors in a parallel configuration in a first phase of operation and in a serial configuration in a second phase of operation.

21. The converter according to claim 20, wherein the number of capacitors included in the input transformer is N, and wherein the input transformer has a transformation ratio at 1:N.

22. The converter according to claim 20, wherein the output of the comparator is fed to a latch, and said latch being controlled by a clock signal and outputs a digital bit stream accordingly, and wherein said latch output is coupled as feedback signal back to the summation point.

23. The converter according to claim 20, wherein the feedback loop comprises a feedback transformer receiving an output from said latch and outputting a transformed voltage to the summation point.

24. The converter according to claim 20, wherein the feedback transformer includes at least two capacitors, a plurality of switching elements and control logic, and wherein the control logic switches the feedback transformer between a first and a second phase of operation.

25. The converter according to claim 24, wherein said plurality of switching elements and control logic is configured to arrange said at least two capacitors in a parallel configuration in said first phase and in a serial configuration in said second phase.

26. The converter according to claim 21, wherein the digital output signal is a digital bit stream having a data rate controlled by the clock signal.

27. A voltage transformer stage for transforming an input voltage to an output voltage, said transformer stage having plurality of switching elements and control logic configured to arrange at least two capacitors in a parallel configuration in a first phase of operation and in a serial configuration in a second phase of operation.

28. A voltage transformer according to claim 27, wherein a ratio of said output voltage to said input voltage is N:1, and said at least two capacitors comprises N identical capacitors.

29. A voltage transformer according to claim 28, wherein N=2.

* * * * *